United States Patent
Ishikawa et al.

(10) Patent No.: US 7,469,457 B2
(45) Date of Patent: Dec. 30, 2008

(54) METHOD OF REMOVING INTEGRATED CIRCUIT CHIP PACKAGE AND DETACHMENT JIG THEREFOR

(75) Inventors: Tetsuji Ishikawa, Kawasaki (JP);
Osamu Saitou, Kawasaki (JP);
Masakazu Kobayashi, Kawasaki (JP);
Hideaki Terauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 196 days.

(21) Appl. No.: 11/061,471

(22) Filed: Feb. 22, 2005

(65) Prior Publication Data
US 2006/0107513 A1   May 25, 2006

(30) Foreign Application Priority Data
Nov. 19, 2004  (JP) .............................. 2004-336703

(51) Int. Cl.
*B23P 19/00* (2006.01)
(52) U.S. Cl. ..................... 29/426.5; 29/426.4; 29/762; 29/764; 438/4; 228/191; 228/119
(58) Field of Classification Search ............... 29/426.1, 29/426.2, 426.4, 426.5, 426.6, 762, 764; 438/4; 81/3.4, 3.57; 228/191, 119, 14
See application file for complete search history.

(56) References Cited

U.S. PATENT DOCUMENTS

| | | | | |
|---|---|---|---|---|
| 3,579,795 A | * | 5/1971 | Burman | 29/252 |
| 3,632,973 A | * | 1/1972 | O'Keefe | 219/230 |
| 3,673,384 A | * | 6/1972 | Burman et al. | 219/230 |
| 3,804,320 A | * | 4/1974 | Vandermark | 228/19 |
| 3,895,214 A | * | 7/1975 | Winter | 219/230 |
| 4,034,202 A | * | 7/1977 | Vandermark | 219/230 |
| 4,274,576 A | * | 6/1981 | Shariff | 228/264 |
| 4,767,047 A | * | 8/1988 | Todd et al. | 228/6.2 |

(Continued)

FOREIGN PATENT DOCUMENTS

JP    8-274460    10/1996

(Continued)

OTHER PUBLICATIONS

English translation of JP 08-274460.*

(Continued)

*Primary Examiner*—Essama Omgba
(74) *Attorney, Agent, or Firm*—Westerman, Hattori, Daniels & Adrian, LLP.

(57) ABSTRACT

A detachment jig is placed on a printed circuit board. Advancement of an inclined surface of the detachment jig is received on a solder bump of solid state disposed between the printed circuit board and an integrated circuit chip package. The solder bump melts to remove restraint to the advancement of the inclined surface, so that the inclined surface advances into a space between the printed circuit board and the chip package in response to the melt of the solder bump. A force to lift the chip package in the direction perpendicular to the surface of the printed circuit board acts on the chip package after the solder bump has completely melted down. Detachment of an electrically conductive pad is thus reliably prevented on the printed circuit board. The chip package can solely be removed without inducing detachment of the electrically conductive pad on the printed circuit board.

5 Claims, 9 Drawing Sheets

U.S. PATENT DOCUMENTS

| | | | | |
|---|---|---|---|---|
| 4,799,617 A | * | 1/1989 | Friedman | 228/180.21 |
| 4,828,162 A | * | 5/1989 | Donner et al. | 228/6.2 |
| 5,054,681 A | * | 10/1991 | Kim | 228/191 |
| 5,216,803 A | * | 6/1993 | Nolan et al. | 29/829 |
| 5,263,620 A | * | 11/1993 | Hernandez et al. | 225/1 |
| 5,355,580 A | * | 10/1994 | Tsukada | 29/840 |
| 5,842,261 A | * | 12/1998 | Ortiz | 29/426.5 |
| 6,119,325 A | * | 9/2000 | Black et al. | 29/426.1 |
| 6,156,150 A | * | 12/2000 | Nishida | 156/344 |
| 7,004,371 B2 | * | 2/2006 | Chin | 228/14 |
| 2004/0111876 A1 | * | 6/2004 | Cheng | 29/762 |
| 2005/0257369 A1 | * | 11/2005 | Daily et al. | 29/832 |

FOREIGN PATENT DOCUMENTS

| | | | |
|---|---|---|---|
| JP | 10056258 A | * | 2/1998 |
| JP | 2001-237539 | | 8/2001 |
| JP | 2002-343838 | | 11/2002 |
| JP | 2006041375 A | * | 2/2006 |
| JP | 2006147888 A | * | 6/2006 |

OTHER PUBLICATIONS

English translation of JP 2002-343838.*

* cited by examiner

METHOD OF REMOVING INTEGRATED CIRCUIT CHIP PACKAGE AND DETACHMENT JIG THEREFOR

BACKGROUND OF THE INVENTION

1. Field of the Invention

The present invention relates to a method of removing an integrated circuit chip package mounted on the surface of a printed circuit board through solder bumps, for example, and to a detachment jig therefore.

2. Description of the Prior Art

As disclosed in Japanese Patent Application Publication No. 2001-237539, a detachment jig is well known for removing an integrated circuit chip package. The detachment jig is utilized in replacement of a defective integrated circuit chip package, for example. In general, the integrated circuit chip package is placed on electrically conductive pads fixed on the surface of the printed circuit board. An adhesive such as a prepreg is utilized to adhere the electrically conductive pads on the printed circuit board, for example. Solder bumps are interposed between the electrically conductive pads and the integrated circuit chip package.

The detachment jig is first placed on the printed circuit board. The printed circuit board is then subjected to heat treatment. Since the melting point of the prepreg is in general lower than that of the solder bumps, the prepreg melts before the melt of the solder bumps. The detachment jig keeps exerting a force to lift up the integrated circuit chip package during the heat treatment, so that the integrated circuit chip package is removed from the printed circuit board along with the solder bumps and the electrically conductive pads. The printed circuit board cannot be reused.

SUMMARY OF THE INVENTION

It is accordingly an object of the present invention to provide a method of removing in a facilitated manner an integrated circuit chip package without detachment of electrically conductive pads. It is an object of the present invention to provide a detachment jig greatly contributing to realization of the aforementioned method.

According to a first aspect of the present invention, there is provided a method of removing an integrated circuit chip package, comprising: placing a detachment jig on a printed circuit board so as to allow advancement of an inclined surface of the detachment jig to be received on a solder bump of solid state disposed between the printed circuit board and the integrated circuit chip package; causing the solder bump to melt so as to remove restraint to the advancement of the inclined surface; and allowing the inclined surface to advance into a space between the printed circuit board and the integrated circuit chip package along a surface of the printed circuit board in response to melt of the solder bump.

The method enables removal of restraint to the advancement of the inclined surface based on the melt of the solder bump. A force to lift the integrated circuit chip package in the direction perpendicular to the surface of the printed circuit board acts on the integrated circuit chip package after the solder bump has completely melted down. Detachment of an electrically conductive pad is thus reliably prevented on the printed circuit board. The integrated circuit chip package can solely be removed away from the printed circuit board in a facilitated manner without inducing detachment of the electrically conductive pad.

According to a second aspect of the present invention, there is provided a method of removing an integrated circuit chip package, comprising: placing a detachment jig on a printed circuit board so as to allow the detachment jig to hold solder bumps of solid state between a pair of grasping portions, said solder bumps located in a row between the printed circuit board and the integrated circuit chip package, said grasping portions having inclined surfaces, respectively, opposed to the outer periphery of the integrated circuit chip package; causing the solder bumps to melt; and allowing the grasping portions to approach each other along the surface of the printed circuit board in response to melt of the solder bumps, so that the inclined surfaces of the grasping portions are glided into a space between the printed circuit board and the integrated circuit chip package.

The method allows the grasping portions to approach each other in response to the melt of the solder bumps. This approach of the grasping portions forces the inclined surfaces to glide into a space between the printed circuit board and the integrated circuit chip package. A force to lift the integrated circuit chip package in the direction perpendicular to the surface of the printed circuit board acts on the integrated circuit chip package after the solder bumps have completely melted down. Detachment of electrically conductive pads is thus reliably prevented on the printed circuit board. The integrated circuit chip package can solely be removed away from the printed circuit board in a facilitated manner without inducing detachment of the electrically conductive pads.

According to a third aspect of the present invention, there is provided a jig for removal of an integrated circuit chip package, said jig mounted on a printed circuit board, comprising: a support body; first and second grasping members designed to move along a straight line on the support body relative to each other; and an elastic member exhibiting elasticity to cause the first and second grasping members to approach each other, wherein said first and second grasping members include: horizontal plates received on the printed circuit board, said horizontal plates having the inner ends opposed to each other; and inclined plates extending from the outer ends of the horizontal plates by a predetermined inclination angle to the horizontal plates, respectively.

The detachment jig is most effective in the aforementioned method. The detachment jig allows the horizontal plates to contact with solder bumps of solid state arranged between the printed circuit board and the integrated circuit chip package. The advancement of the horizontal plates is thus prevented. When the solder bumps melt down, the elasticity of the elastic member serves to glide the inclined plates into a space between the printed circuit board and the integrated circuit chip package. Accordingly, the inclined plates are only allowed to exert a force on the integrated circuit chip package to lift the integrated circuit chip package in the direction perpendicular to the surface of the printed circuit board when the solder bumps have completely melted down. Detachment of electrically conductive pads is thus reliably prevented on the printed circuit board. The integrated circuit chip package can solely be removed away from the printed circuit board in a facilitated manner without inducing detachment of the electrically conductive pads.

In addition, the horizontal plates and the inclined plates are only required to occupy a smaller space along the surface of the printed circuit board. The detachment jig is operative in a smaller space around the integrated circuit chip package along the surface of the printed circuit board. Moreover, a simple adjustment of the length of the elastic member enables application of the detachment jig to various sizes or peripheral shapes of the integrated circuit chip packages. The utility of the detachment jig can in this manner be improved. Furthermore, since a simple mechanism or structure is utilized in the detachment jig, the detachment jig may have only a smaller thermal capacity. This leads to avoidance of reduction in the temperature in the atmosphere containing the printed circuit board and the integrated circuit chip package.

According to a fourth aspect of the present invention, there is provided a jig for removal of an integrated circuit chip package, said jig mounted on a printed circuit board, comprising: a pair of first members received on the surface of the printed circuit board at positions spaced from each other; a second member located at a position between the first members; and connecting members connecting the second member to each of the first members, said connecting members designed to deform from the original shape so as to distance the second member away from the surface of the printed circuit board when temperature reaches a predetermined threshold higher than the normal temperature, said connecting members taking the original shape at the normal temperature.

The detachment jig may allow the connecting members to deform at the predetermined threshold higher than the melting point of solder bumps. The integrated circuit chip package may be received on the surface of the second member in the detachment jig. When the printed circuit board along with the detachment jig is subjected to heat treatment, the solder bumps completely melt down. The connecting members subsequently deform to distance the second member away from the surface of the printed circuit board. Accordingly, the detachment jig is only allowed to exert a force on the integrated circuit chip package to lift the integrated circuit chip package in the direction perpendicular to the surface of the printed circuit board when the solder bumps have completely melted down. Detachment of electrically conductive pads is thus reliably prevented on the printed circuit board. The integrated circuit chip package can solely be removed away from the printed circuit board in a facilitated manner without inducing detachment of the electrically conductive pads.

In addition, the first and second members are only required to occupy a smaller space along the surface of the printed circuit board. The detachment jig is operative in a smaller space around the integrated circuit chip package along the surface of the printed circuit board. Moreover, a threshold temperature can be set for the connecting members in conformity with the melting point of the solder bumps. The detachment jig may be utilized for various types of the solder bumps.

The first and second members and the connecting members may be formed in a single bimetallic plate. Alternatively, the first and second members and the connecting members may be formed in a single plate made of a memory metal. Detachment jig may further comprise a holder attached to the surface of the second member. The holder may be designed to hold the integrated circuit chip package.

According to a fifth aspect of the present invention, there is provided a jig for removal of an integrated circuit chip package, said jig mounted on a printed circuit board, comprising: a plate member received on the surface of the printed circuit board; a piece member opposed to the surface of the plate member; an elastic member connected to the plate member and the piece member, said elastic member exhibiting elasticity to distance the piece member away from the plate member, said piece member being at a position distanced from the plate member by a predetermined distance; and a joint member connecting the piece member at the position at the normal temperature with the plate member, said joint member designed to melt at a high temperature higher than the normal temperature.

The detachment jig may allow the joint member to melt at the high temperature higher than the melting point of solder bumps. The integrated circuit chip package may be received on the surface of the piece member in the detachment jig. When the printed circuit board along with the detachment jig is subjected to heat treatment, the solder bumps completely melt down. The joint member subsequently melts down. The connection is in this manner released between the piece member and the plate member. The elasticity of the elastic member thus serves to distance the piece member away from the plate member. Accordingly, the detachment jig is only allowed to exert a force on the integrated circuit chip package to lift the integrated circuit chip package in the direction perpendicular to the surface of the printed circuit board when the solder bumps have completely melted down. Detachment of electrically conductive pads is thus reliably prevented on the printed circuit board. The integrated circuit chip package can solely be removed away from the printed circuit board in a facilitated manner without inducing detachment of the electrically conductive pads. The detachment jig may further comprise a holder attached to the surface of the piece member. The holder may be designed to hold the integrated circuit chip package.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
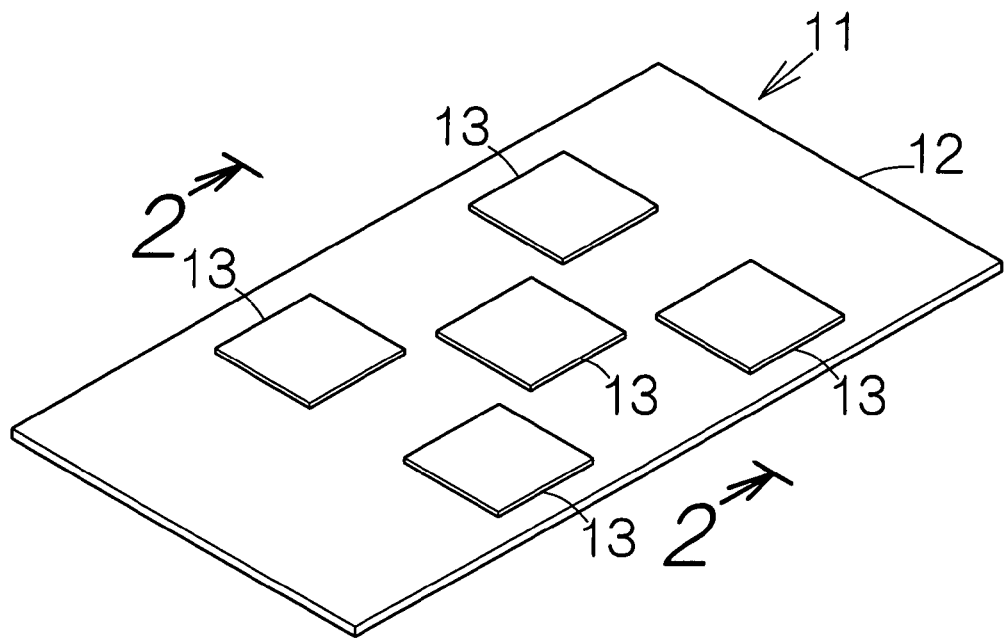
FIG. 1 is a perspective view schematically illustrating the structure of a printed circuit board unit according to a specific example.

FIG. 1 schematically illustrates a printed circuit board unit 11 according to a specific example of the present invention. The printed circuit board unit 11 includes a printed circuit board 12. Electronic components or devices or integrated circuit chip packages such as central processing units, CPUs, 13 are mounted on the front surface of the printed circuit board 12. Signal line patterns, not shown, made of an electrically conductive material are employed to connect the integrated circuit chip packages 13 to each other, for example. The signal line patterns may extend on the front and back surfaces of the printed circuit board 12.

Figure 2:
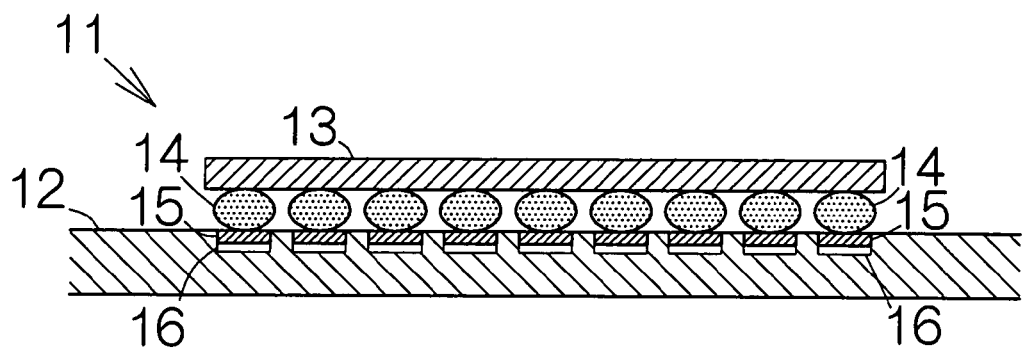
FIG. 2 is an enlarged partial sectional view taken along the line 2-2 in FIG. 1.

As shown in FIG. 2, solder bumps 14 of solid state are located between the integrated circuit chip package 13 and the printed circuit board 12. The solder bumps 14 are arranged in a matrix inside the outer periphery of the integrated circuit chip package 13. A predetermined space is established between the adjacent ones of the solder bumps 14. The solder bumps 14 may be made of an electrically conductive material such as a mixture of tin and lead, a mixture of tin, silver and copper, or the like.

Electrically conductive pads 15 are formed on the front surface of the printed circuit board 12. The electrically conductive pads 15 may be made of an electrically conductive material such as copper, for example. The solder bumps 14 are received on the surfaces of the corresponding electrically conductive pads 15. An adhesive layer 16 such as a prepreg layer is utilized to adhere the electrically conductive pads 15 on the printed circuit board 12. The adhesive layer may be made of a resin material, for example. The aforementioned signal line patterns are connected to the electrically conductive pads 15.

The lower surface of the integrated circuit chip package 13 is received on the solder bumps 14. The solder bumps 14 thus serve to establish electric connection between the printed circuit board 12 and the integrated circuit chip package 13.

Figure 3:
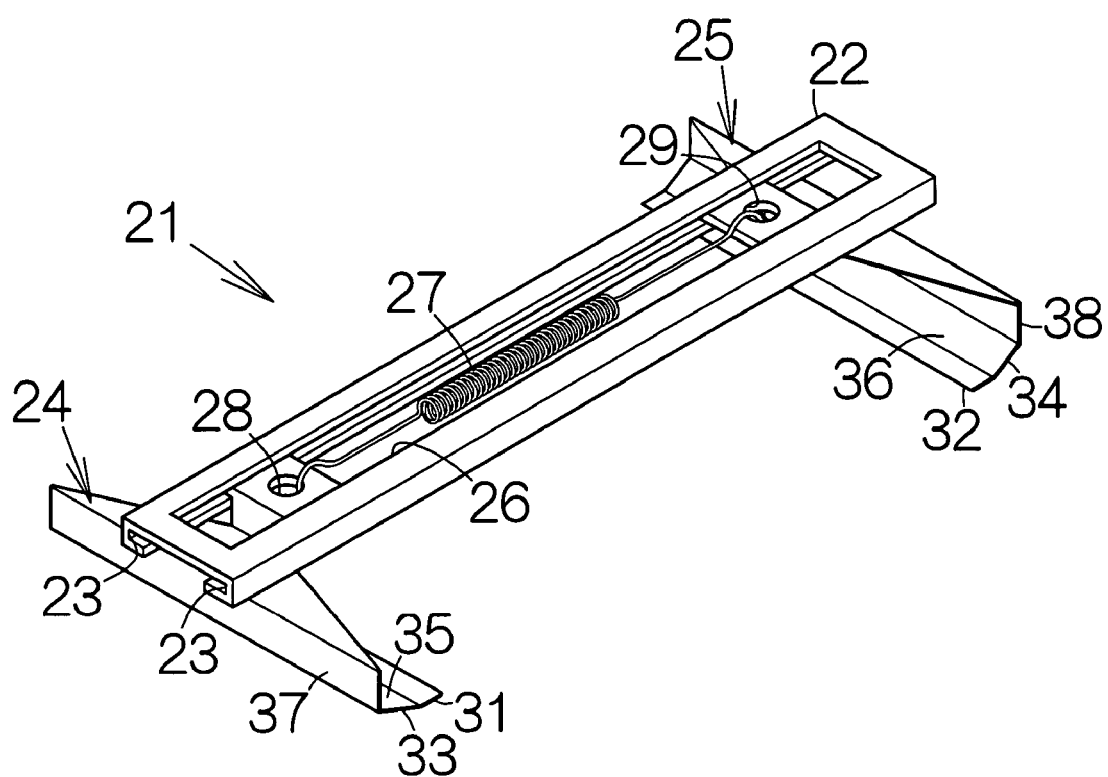
FIG. 3 is a perspective view schematically illustrating the structure of a detachment jig according to a first embodiment of the present invention.

FIG. 3 illustrates the structure of a detachment jig 21 according to a first embodiment of the present invention. The detachment jig 21 includes a support body 22 extending in the horizontal direction along a straight line. Parallel guide grooves 23, 23 are formed on the support body 22 along the straight line. The guide grooves 23, 23 receive first and second grasping members 24, 25, respectively. The first and second grasping members 24, 25 are thus allowed to move on the support body 22 along the straight line relative to each other. The support body 22 may be made of a metallic plate such as an aluminum plate, for example. Bending process may be utilized to form the support body 22 out of the metallic plate.

A coil spring 27 serving as an elastic member is interposed between the first and second grasping members 24, 25. The coil spring 27 is located inside an opening 26 defined in the support body 22. One end of the coil spring 27 is connected to the first grasping member 24 through a through bore 28 defined in the first grasping member 24. The other end of the coil spring 27 is likewise connected to the second grasping member 25 through a through bore 29 defined in the second grasping member 25.

Horizontal plates 31, 32 are defined in the first and second grasping members 24, 25, respectively. The inner ends of the horizontal plates 31, 32 are opposed to each other. The horizontal plates 31, 32 are allowed to extend in the direction perpendicular to the aforementioned straight line along a horizontal plane. The horizontal plates 31, 32 have a lateral width larger than intervals between the adjacent ones of the solder bumps 14 in the direction perpendicular to the straight line. Here, the lateral width of the horizontal plates 31, 32 are set equal to one third of the lateral width of the integrated circuit chip package 13 approximately in the direction perpendicular to the straight line.

Inclined plates 33, 34 are further defined in the first and second grasping members 24, 25, respectively. The inclined plates 33, 34 extend from the outer ends of the horizontal plates 31, 32, respectively, by a predetermined inclination angle to the horizontal plates 31, 32. The inclined plates 33, 34 are designed to define inclined surfaces 35, 36. Vertical plates 37, 38 are connected to the outer ends of the inclined plates 33, 34 in the first and second grasping members 24, 25, respectively. The vertical plates 37, 38 may extend in the vertical direction perpendicular to the horizontal plates 31, 32.

The first and second grasping members 24, 25 may be formed in a single metallic plate such as an aluminum plate, for example. Bending process may be utilized to form the horizontal plates, 31, 32, the inclined plates 33, 34 and the vertical plates 37, 38 out of the metallic plate. The detachment jig 21 can completely be mounted on the printed circuit board 12 for conveyance or carriage.

The length of the coil spring 27 may be adjusted in conformity with the size of the integrated circuit chip package 13 in the detachment jig 21. The coil spring 27 is only required to exhibit an elasticity enough to shrink to make the first and second grasping members 24, 25 closer to each other when the integrated circuit chip package 13 is held between the vertical plates 37, 38, for example.

Figure 4:
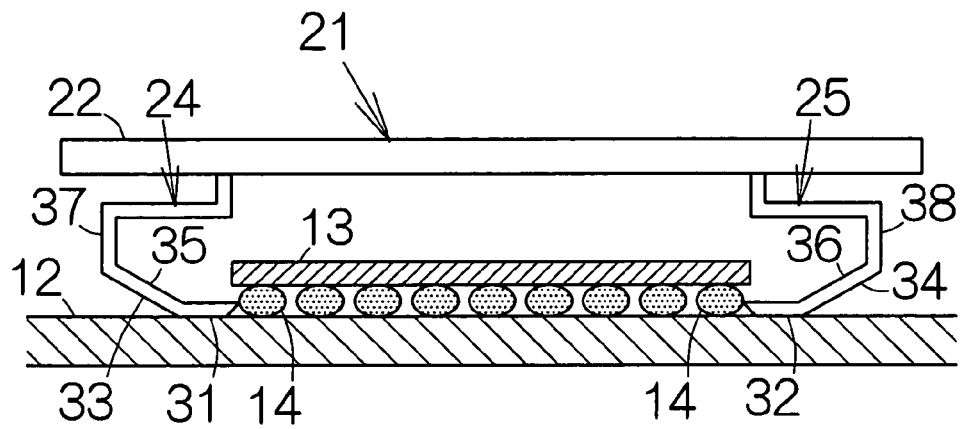
FIG. 4 is a side view of the detachment jig placed on a printed circuit board.
Figure 5:
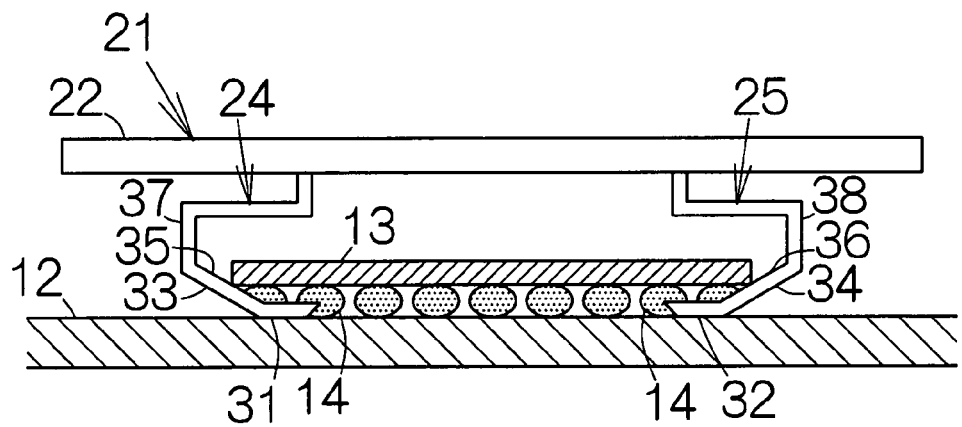
FIG. 5 is a side view of the detachment jig after the melt of solder bumps.

Next, assume that the integrated circuit chip package 13 is removed with the detachment jig 21. As shown in FIG. 4, the detachment jig 21 is placed on the printed circuit board 12. In this case, the integrated circuit chip package 13 is placed in an atmosphere of the normal or room temperature. The coil spring 27 is elongated or stretched to distance the first and second grasping members 24, 25 from each other. Elasticity to shrink is thus stored in the coil spring 27. The first and second horizontal plates 31, 32 are received on the front surface of the printed circuit board 12. The coil spring 27 shrinks so that the first and second grasping members 24, 25 are forced to advance toward the outer periphery of the integrated circuit chip package 13.

The horizontal plates 31, 32 then contact with the outermost ones of the solid solder bumps 14. The advancement of the horizontal plates 31, 32 is thus restrained. The horizontal plates 31, 32 serve to hold the rows of the solder bumps 14 therebetween within a space between the printed circuit board 12 and the integrated circuit chip package 13. The detachment jig 21 is in this manner attached to the printed circuit board 12 through the integrated circuit chip package 13. In this case, the inclined surfaces 35, 36 are opposed to the outer periphery of the integrated circuit chip package 13. The inclined surfaces 35, 36 are distanced from the corresponding outer periphery of the integrated circuit chip package 13 at a predetermined distance.

The printed circuit board unit 11 along with the detachment jig 21 is placed into a reflow oven, not shown. Here, the solder bumps 14 are made of a mixture of tin and lead, for example. The melting point of the mixture is set at 183 degrees Celsius.

The printed circuit board unit 11 is subjected to heat treatment in the reflow oven. The temperature reaches a predetermined level higher than the melting point of the mixture in the reflow oven. The solder bumps 14 thus melt down.

When the solder bumps 14 melt, restraint to the advancement of the inclined surfaces 35, 36 and the horizontal plates 31, 32 is removed. The elasticity of the coil spring 27 causes the first and second grasping members 24, 25 to get closer to each other. The inclined surfaces 35, 36 thus glide into a space between the printed circuit board 12 and the integrated circuit chip package 13. The outer periphery of the integrated circuit chip package 13 moves upward along the inclined surfaces 35, 36. As the outer periphery of the integrated circuit chip package 13 slides upward on the inclined surfaces 35, 36, the integrated circuit chip package 13 is distanced away from the front surface of the printed circuit board 12.

Figure 6:
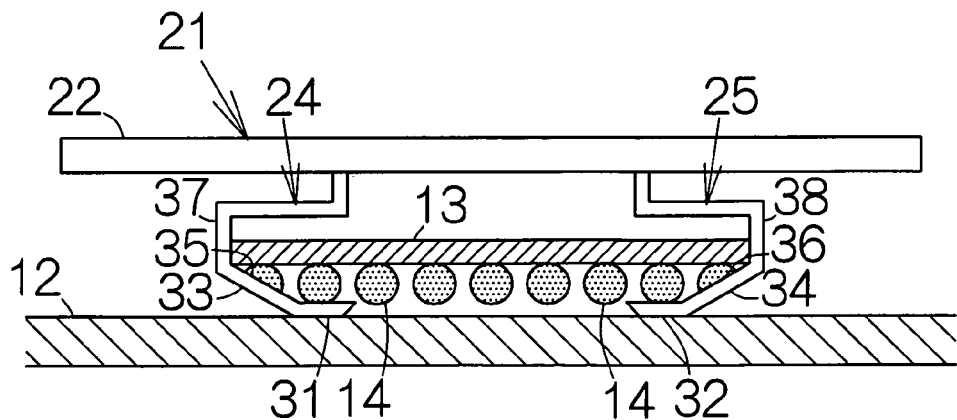
FIG. 6 is a side view of the detachment jig detaching an integrated circuit chip package from the printed circuit board.

As shown in FIG. 6, the vertical plates 37, 38 then contact with the outer periphery of the integrated circuit chip package 13. The integrated circuit chip package 13 is thus completely detached from the printed circuit board 12. The integrated circuit chip package 13 is held between the vertical plates 37, 38 of the first and second grasping members 24, 25 based on the elasticity of the coil spring 27. The detachment jig 21 is thereafter taken away from the printed circuit board 12. The integrated circuit chip package 13 accompanies the detachment jig 21.

The detachment jig 21 enables removal of restraint to the advancement of the inclined surfaces 35, 36 based on the melt of the solder bumps 14. A force to lift the integrated circuit chip package 13 in the vertical direction perpendicular to the front surface of the printed circuit board 12 acts on the integrated circuit chip package 13 after the solder bumps 14 have completely melted down. Detachment of the electrically conductive pads 15 is thus reliably prevented. The integrated circuit chip package 13 can solely be removed away from the printed circuit board 12 in a facilitated manner without inducing detachment of the electrically conductive pads 15.

In addition, the first and second grasping members 24, 25 of the detachment jig 21 are only required to occupy a smaller space along the front surface of the printed circuit board 12. The detachment jig 21 is operative in a smaller space around the integrated circuit chip package 13 along the front surface of the printed circuit board 12. Moreover, a simple adjustment of the length of the coil spring 27 enables application of the detachment jig 21 to various sizes or peripheral shapes of the integrated circuit chip packages 13. The utility of the detachment jig 21 can in this manner be improved. Furthermore, since a simple mechanism or structure is utilized in the detachment jig 21, the detachment jig 21 may have only a smaller thermal capacity. This leads to avoidance of reduction in the temperature in the reflow oven. A thermostatic chamber, a hot plate, or the like, may be employed in place of the aforementioned reflow oven.

Figure 7:
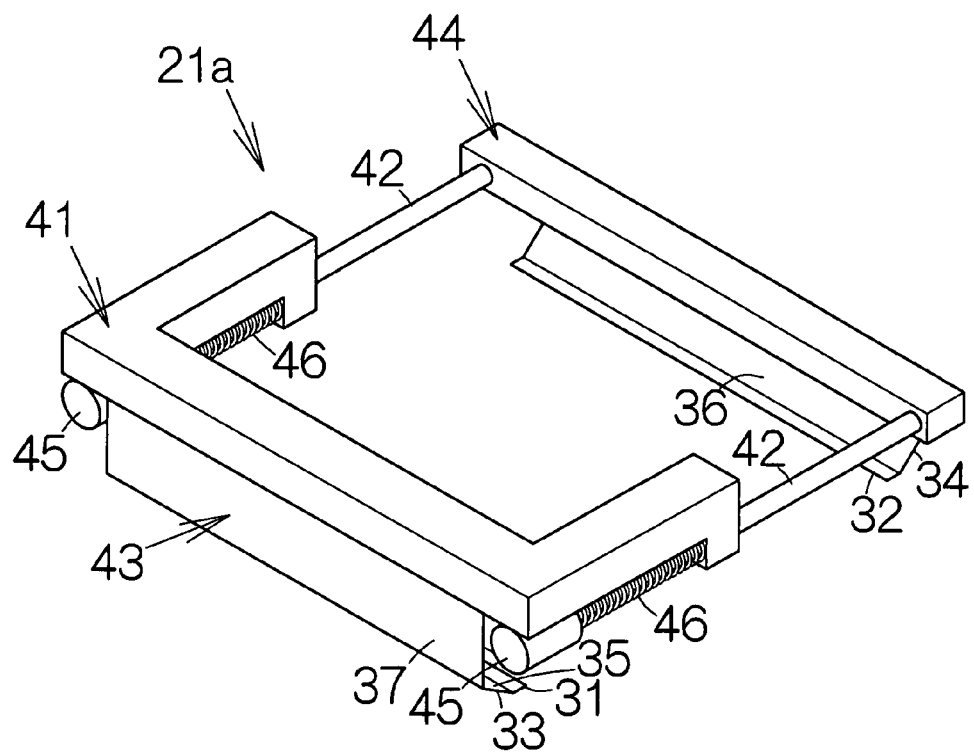
FIG. 7 is a perspective view schematically illustrating the structure of a detachment jig according to a second embodiment of the present invention.

FIG. 7 illustrates the structure of a detachment jig 21a according to a second embodiment of the present invention. The detachment jig 21a includes a support body 41. A pair of movable shaft 42, 42 is coupled to the support body 41 for elative axial movement. The movable shafts 42 extend in the horizontal direction in parallel with each other. The movable shafts 42 penetrate through the support body 41. A first grasping member 43 is fixed to the support body 41. A second grasping member 44 is fixed to the end of the movable shafts 42. The second grasping member 44 is in this manner opposed to the first grasping member 43. The first and second grasping members 43, 44 are allowed to move relative to each other along a straight line established on the support body 41. The support body 41 and the first and second grasping members 43, 44 may be made of a metallic material such as aluminum, for example. The first grasping member 43 may be integral to the support member 41, for example.

Flanges 45, 45 are formed on the other ends of the movable shafts 42, 42, respectively. The flange 45 extends outward from the movable shaft 42 in the direction perpendicular to the longitudinal axis of the movable shaft 42. A coil spring 46 is wound around the individual movable shaft 42 between the flange 45 and the support body 41. Like reference numerals are attached to structure or components equivalent to those of the aforementioned first embodiment. The length of the coil spring 46 may be adjusted in conformity with the size of the integrated circuit chip package 13 in the manner as described above. The coil spring 46 is only required to exhibit elasticity enough to make the first and second grasping members 43, 44 closer to each other when the integrated circuit chip package 13 is intended to be held between the vertical plates 37, 38, for example.

The detachment jig 21a is placed on the front surface of the printed circuit board 12 upon removal of the integrated circuit chip package 13. The first and second grasping members 43, 44 are first distanced from each other. The coil springs 46 get shrunk between the flanges 45 and the support body 41. Elasticity to stretch is thus stored in the coil springs 46. The first and second horizontal plates 31, 32 are received on the front surface of the printed circuit board 12. The coil springs 46 get elongated so that the first and second grasping members 43, 44 are forced to advance toward the outer periphery of the integrated circuit chip package 13.

The horizontal plates 31, 32 then contact with the outermost ones of the solid solder bumps 14 of solid state. The advancement of the horizontal plates 31, 32 is thus restrained. The horizontal plates 31, 32 serve to hold the rows of the solder bumps 14 therebetween within a space between the printed circuit board 12 and the integrated circuit chip package 13. The detachment jig 21a is in this manner attached to the printed circuit board 12 through the integrated circuit chip package 13. In this case, the inclined surfaces 35, 36 are opposed to the outer periphery of the integrated circuit chip package 13.

The printed circuit board unit 11 along with the detachment jig 21a is placed into a reflow oven. When the solder bumps 14 melt, the elasticity of the coil springs 46 causes the inclined surface 35, 36 to advance into a space between the printed circuit board 12 and the integrated circuit chip package 13. The outer periphery of the integrated circuit chip package 13 moves upward along the inclined surfaces 35, 36. The integrated circuit chip package 13 is completely detached from the printed circuit board 12 in the aforementioned manner. One can enjoy advantages of the detachment jig 21a in the same manner as the aforementioned detachment jig 21.

Figure 8:
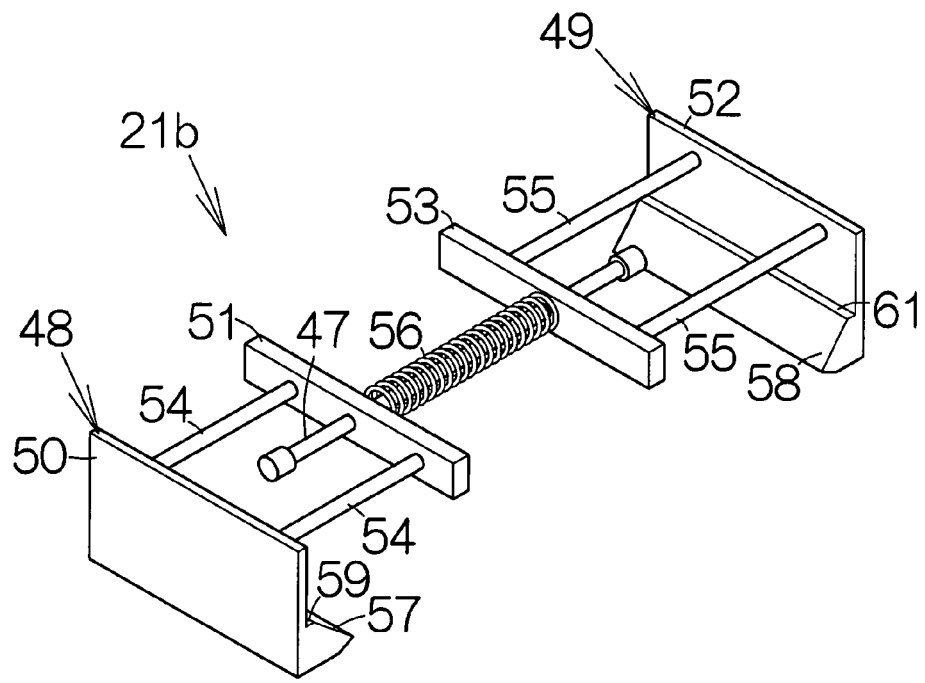
FIG. 8 is a perspective view schematically illustrating the structure of a detachment jig according to a third embodiment of the present invention.

FIG. 8 illustrates the structure of a detachment jig 21b according to a third embodiment of the present invention. The detachment jig 21b includes a support body 47 extending in the horizontal direction along a straight line. First and second grasping members 48, 49 are supported on the support body 47 for relative movement along the straight line.

The first grasping member 48 includes a body 50 and a support member 51 supported on the support body 47 for relative movement along the straight line. The second grasping member 49 likewise includes a body 52 and a support member 53 supported on the support body for relative movement along the straight line. The support member 51 is coupled to the body 50 through a pair of connecting member 54, 54. The support member 53 is likewise coupled to the body 52 through a pair of connecting member 55, 55. The support body 47, the bodies 50, 52, the support members 51, 53 and the connecting members 45, 55 may be made of a metallic material such as aluminum, for example.

A coil spring 56 is wound around the support body 47 between the support members 51, 53. The end of the coil spring 56 is fixed to the support member 51. The other end of the coil spring 56 is fixed to the support member 53. The length of the coil spring 56 may be adjusted in conformity with the size of the integrated circuit chip package 13 in the manner as described above. The coil spring 56 is only required to exhibit elasticity enough to make the first and second grasping members 43, 44 closer to each other when the integrated circuit chip package 13 is intended to be held between the bodies 50, 52, for example.

Inclined surfaces 57, 58 are defined on the bodies 50, 52, respectively. The inner ends of the inclined surfaces 57, 58 are opposed to each other. The inclined surface 57, 58 extends from a horizontal plane by a predetermined inclination angle to the horizontal plane. The lateral width of the inclined surfaces 57, 58 are set larger than the space between the adjacent ones of the solder bumps 14 in the direction perpendicular to the aforementioned straight line. Here, the lateral width of the inclined surfaces 57, 58 are set equal to one third of the lateral width of the integrated circuit chip package 13 approximately in the direction perpendicular to the straight line. Narrow horizontal surfaces 59, 61 are connected to the outer ends of the inclined surfaces 57, 58, respectively.

Figure 9:
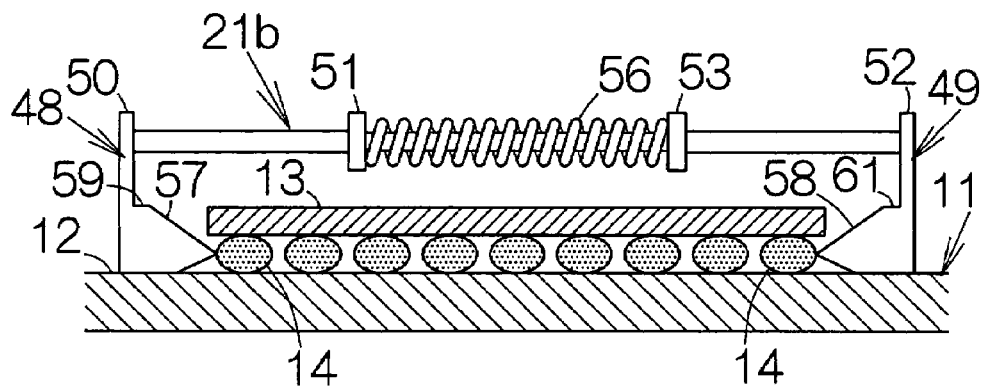
FIG. 9 is a side view of the detachment jig placed on a printed circuit board.

As shown in FIG. 9, the detachment jig 21b is placed on the front surface of the printed circuit board 12 upon removal of the integrated circuit chip package 13. The first and second grasping members 48, 49 are first distanced from each other. The coil spring 56 stretches between the support members 51, 53. Elasticity to shrink is thus stored in the coil springs 56. The bottom surfaces of the bodies 50, 52 are received on the front surface of the printed circuit board 12. The coil spring 56 then shrinks so that the first and second grasping members 48, 49 are forced to advance toward the outer periphery of the integrated circuit chip package 13.

The inner ends of the inclined surfaces 57, 58 then contact with the outermost ones of the solid solder bumps 14 of solid state. The advancement of the inclined surfaces 57, 58 is thus restrained. The inner ends of the inclined surfaces 57, 58 serve to hold the rows of the solder bumps 14 therebetween within a space between the printed circuit board 12 and the integrated circuit chip package 13. The detachment jig 21b is in this manner attached to the printed circuit board 12 through the integrated circuit chip package 13. In this case, the inclined surfaces 57, 58 are opposed to the outer periphery of the integrated circuit chip package 13. The inclined surfaces 57, 58 are distanced from the corresponding outer periphery of the integrated circuit chip package 13 at a predetermined distance.

Figure 10:
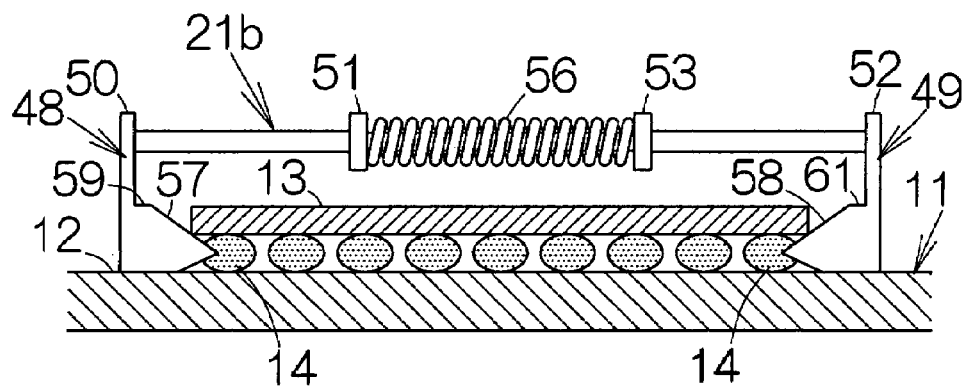
FIG. 10 is a side view of the detachment jig after the melt of solder bumps.

The printed circuit board unit 11 along with the detachment jig 21b is placed into a reflow oven. When the solder bumps 14 melt, restraint to the advancement of the inclined surfaces 57, 58 is removed, as shown in FIG. 10. The elasticity of the coil spring 56 causes the first and second grasping members 48, 49 to get closer to each other. The inclined surfaces 57, 58 are in this manner allowed to glide into a space between the printed circuit board 12 and the integrated circuit chip package 13.

Figure 11:
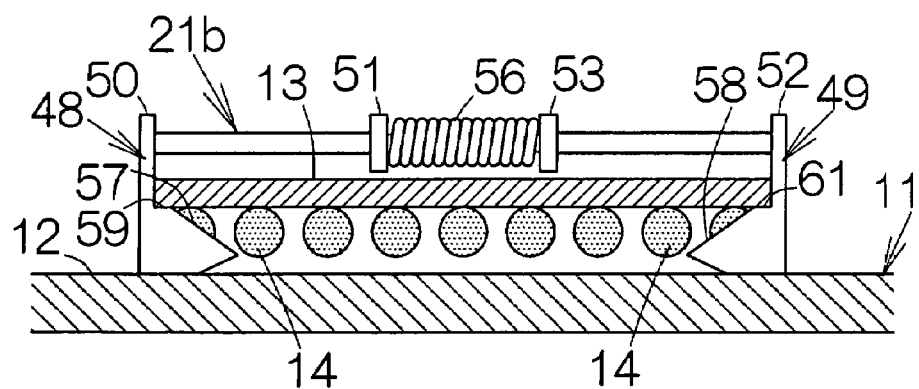
FIG. 11 is a side view of the detachment jig detaching an integrated circuit chip package from the printed circuit board.

As shown in FIG. 11, the integrated circuit chip package 13 is thereafter held between the first and second grasping members 48, 49 based on the elasticity of the coil spring 56. The detachment jig 21b is then taken away from the printed circuit board 12. The integrated circuit chip package 13 is accompanies the detachment jig 21b. One can enjoy advantages of the detachment jig 21b in the same manner as the aforementioned detachment jigs 21, 21a.

Figure 12:
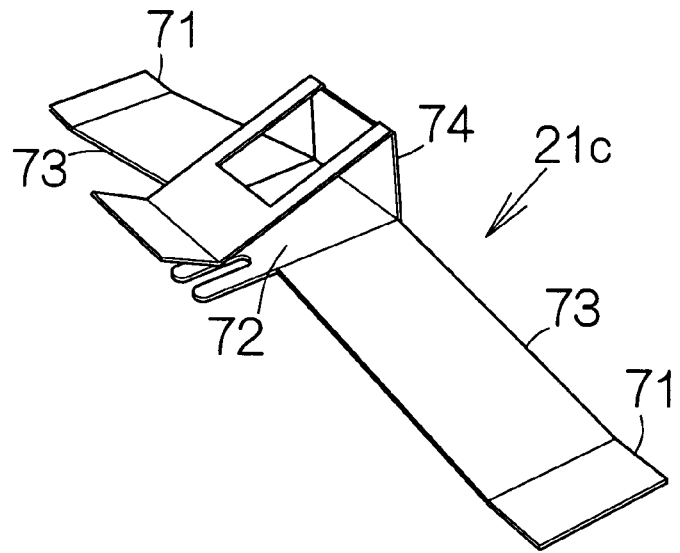
FIG. 12 is a perspective view schematically illustrating the structure of a detachment jig according to a fourth embodiment of the present invention.

FIG. 12 illustrates the structure of a detachment jig 21c according to a fourth embodiment of the present invention. The detachment jig 21b includes a pair of first member 71, 71 received on the front surface of the printed circuit board 12 at positions spaced from each other. A second member 72 is located at a position between the first members 71, 71. The first and second members 71, 72 may be arranged along a straight line. The second member 72 extends in parallel with the first members 71. The first and second members 71, 72 are set in parallel with the front surface of the printed circuit board 12.

Connecting members 73, 73 are employed to connect the second member 72 to the individual first members 71, 71, respectively. The connecting members 73 extend by a predetermined inclination angle to a horizontal plane connecting the first members 71. A holder 74 is coupled to the upper surface of the second member 72 for holding the integrated circuit chip package 13. An adhesive may be interposed between the holder 74 and the upper surface of the second member 72 for fixation of the holder 74, for example. The open ends of the holder 74 are directed in the direction perpendicular to the aforementioned straight line.

The first, second and connecting members 71, 72, 73 may be formed in a single metallic plate, for example. Bending process may be utilized to form the first, second and connecting members 71, 72, 73 out of a single metallic plate. The single metallic plate may be made of a bimetal, a memory metal, or the like. The bimetallic plate or the memory metal plate is allowed to deform from the original shape when the temperature reaches a predetermined threshold higher than the normal or room temperature. The bimetallic plate or the memory metal plate take the original shape at the normal temperature. Here, the predetermined threshold may be set higher than the melting point of the solder bumps 14. The predetermined threshold may be set in a range between 200 degrees Celsius and 220 degrees Celsius. This deformation of the connecting members 73 causes the second member 72 to get distanced from the front surface of the printed circuit board 12.

Figure 13:
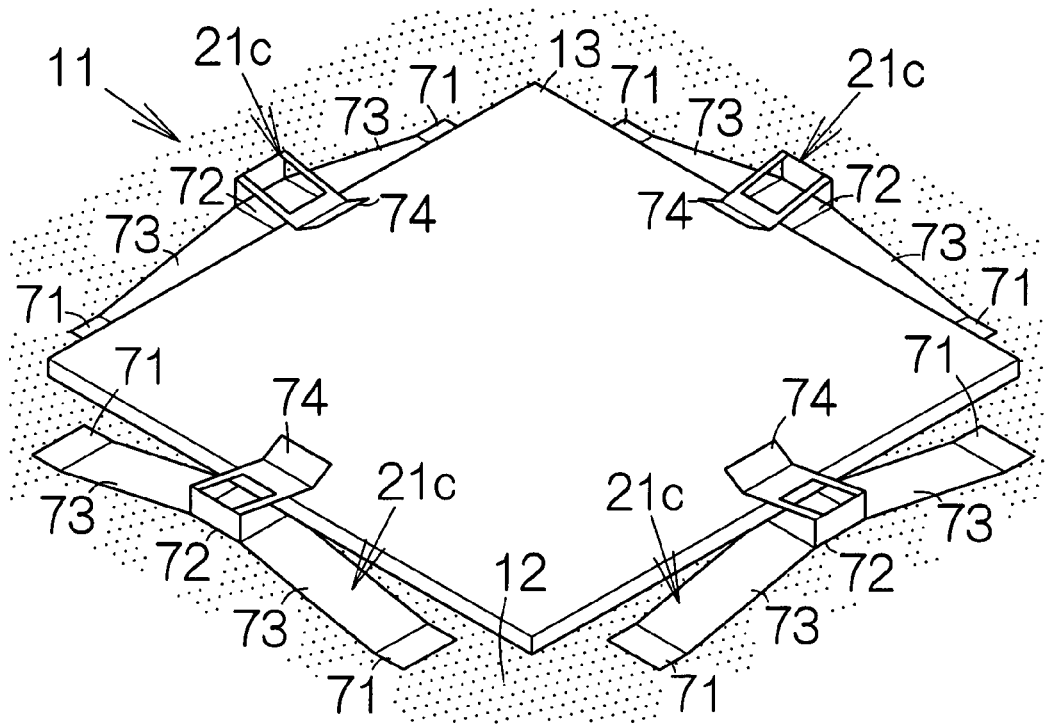
FIG. 13 is a perspective view of an integrated circuit chip package with the detachment jigs.

As shown in FIG. 13, the detachment jigs 21c are individually attached to four sides of the integrated circuit chip package 13 upon removal of the integrated circuit chip package 13, for example. In this case, the integrated circuit chip package 13 is placed in an atmosphere of the normal temperature. The first members 71 are received on the front surface of the printed circuit board 12. The aforementioned straight line of the individual detachment jig 21c may be set in parallel with the side of the integrated circuit chip package 13.

Figure 14:
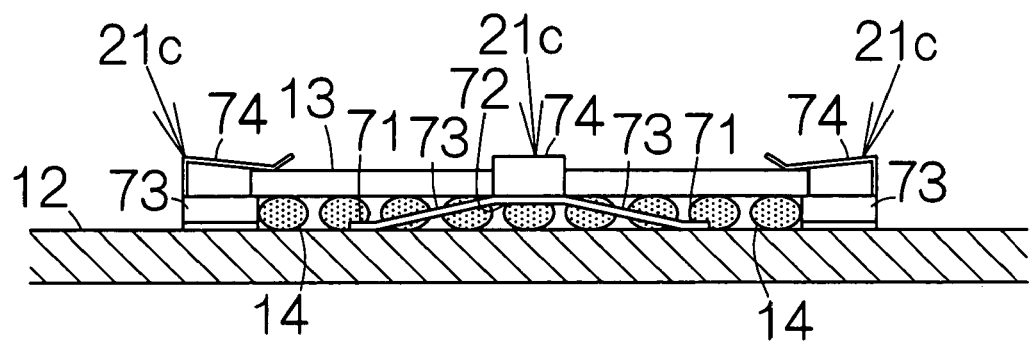
FIG. 14 is a side view of the detachment jig placed on a printed circuit board.

Referring also to FIG. 14, the tip end of the second member 72 is inserted under the integrated circuit chip package 13 in a space between the printed circuit board 12 and the integrated circuit chip package 13. The holder 74 serves to hold the integrated circuit chip package 13 so as to establish contact between the second member 72 and the lower surface of the integrated circuit chip package 13. The detachment jigs 21c are in this manner mounted on the printed circuit board 12. The printed circuit board unit 11 is then placed in a reflow oven along with the detachment jigs 21c. When the printed circuit board unit 11 is subjected to heat treatment in the reflow oven, the solder bumps 14 melt.

Figure 15:
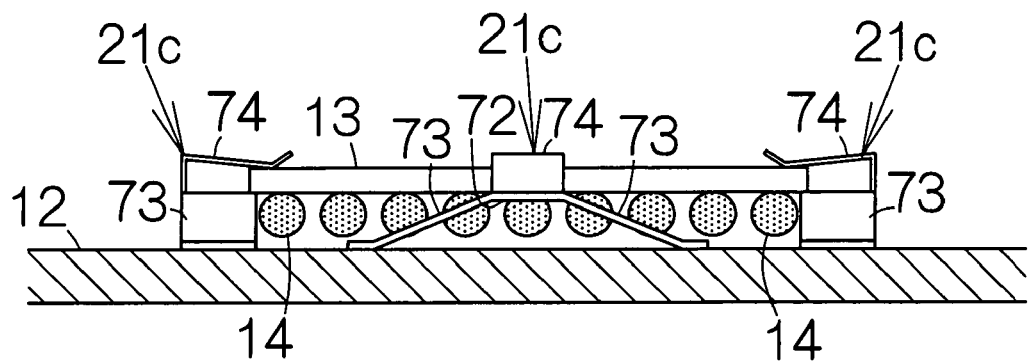
FIG. 15 is a side view of the detachment jig after the melt of the solder bumps.

When the temperature reaches 200 degrees Celsius in the reflow oven, for example, the solder bumps 14 completely melt down. As shown in FIG. 15, deformation is subsequently induced in the connecting members 73. The deformation serves to distance the second member 72 away from the front surface of the printed circuit board 12. The second member 72 in this manner drives the integrated circuit chip package 13 upward in the direction perpendicular to the front surface of the printed circuit board 12. The printed circuit chip package 12 is thus completely detached from the printed circuit board 12. The integrated circuit chip package 13 is thereafter removed from the front surface of the printed circuit board 12 along with the integrated circuit chip package 13.

The detachment jig 21c enables rise of the integrated circuit chip package 13 in the direction perpendicular to the front surface of the printed circuit board 13 completely after the solder bumps 14 have melted down. Detachment of the electrically conductive pads 15 is thus reliably prevented. The integrated circuit chip package 13 can solely be removed away from the printed circuit board 12 in a facilitated manner without inducing detachment of the electrically conductive pads 15.

In addition, the first and second members 71, 72 of the detachment jig 21c are only required to occupy a smaller space along the front surface of the printed circuit board 12. The detachment jig 21c is operative in a smaller space around the integrated circuit chip package 13 along the front surface of the printed circuit board 12. Moreover, a threshold temperature can be set for the connecting members 73 in conformity with the melting point of the solder bumps 14. The detachment jig 21c may be utilized for various types of the solder bumps 14.

Figure 16:
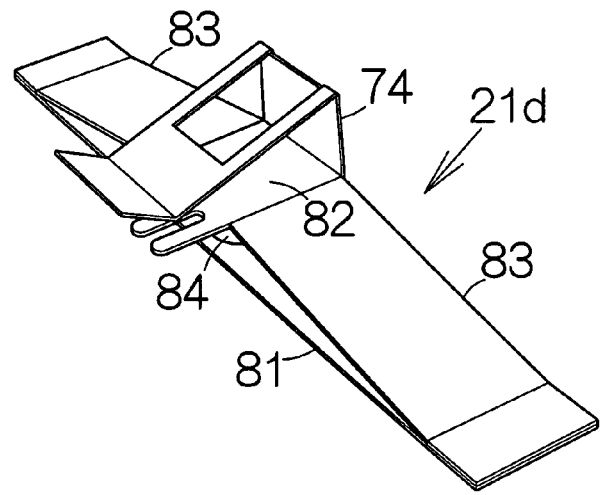
FIG. 16 is a perspective view schematically illustrating the structure of a detachment jig according to a fifth embodiment of the present invention.

FIG. 16 illustrates the structure of a detachment jig according to fifth embodiment of the present invention. The detachment jig 21d includes a plate member 81 received on the front surface of the printed circuit board 12. The plate member 81 extends in the horizontal direction along a straight line. The plate member 81 may be made of a metallic plate such as an aluminum plate, for example. A piece member 82 is opposed to the upper surface of the plate member 81. The piece member 82 is located at a position distanced from the plate member 81 at a predetermined distance. The piece member 82 is set in parallel with the plate member 81, for example.

Elastic members 83, 83 are connected to the opposite ends of the piece member 82. The elastic member 83 extends from the piece member 82 until the elastic member 83 is superposed on the upper surface of the plate member 81 at the other end. The elastic member 83 is in this manner coupled to the plate member 81. The elastic member 83 exerts elasticity on the piece member 82 to as to distance the piece member 82 away from the plate member 81. Here, the piece member 82 and the elastic members 83, 83 may be formed in a single metallic plate, for example. Bending process may be utilized to form the piece member 82 and the connecting members 83 out of a single metallic plate.

A joint member 84 is interposed between the plate member 81 and the piece member 82. The joint member 84 serves to fixedly couple the piece member 82 with the plate member 81. The elasticity is stored in the elastic members 83 in a condition where the piece member 82 is coupled with the plate member 81. The joint member 84 is designed to melt at a high temperature higher than the normal temperature. Here, the joint member 84 may be made of a high temperature solder material, for example. The melting point of the high temperature solder material may be set at 200 degrees Celsius approximately, for example.

The holder 74 is coupled to the upper surface of the piece member 82 for holding the integrated circuit chip package 13 in the same manner as described above. An adhesive may be interposed between the holder 74 and the upper surface of the piece member 82 for fixation of the holder 74, for example. The open ends of the holder 74 are directed in the direction perpendicular to the aforementioned straight line.

Figure 17:
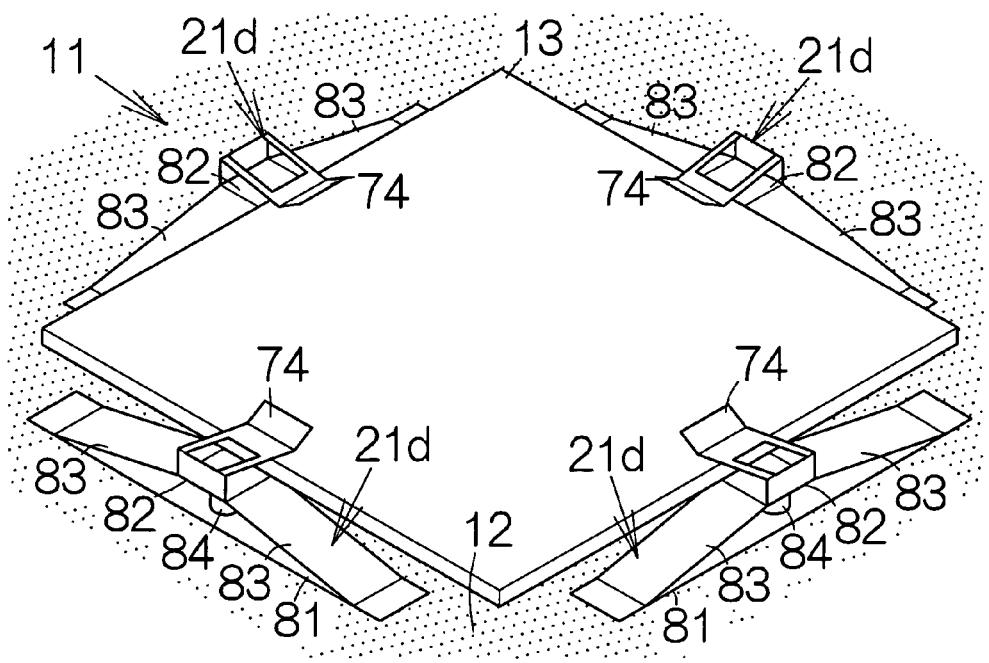
FIG. 17 is a perspective view of an integrated circuit chip package with the detachment jigs.

As shown in FIG. 17, the detachment jigs 21d are individually attached to four sides of the integrated circuit chip package 13 upon removal of the integrated circuit chip package 13, for example. In this case, the integrated circuit chip package 13 is placed in an atmosphere of the normal temperature. The plate member 81 is received on the front surface of the printed circuit board 12. The plate member 81 is set in parallel with the side of the integrated circuit chip package 13, for example.

Figure 18:
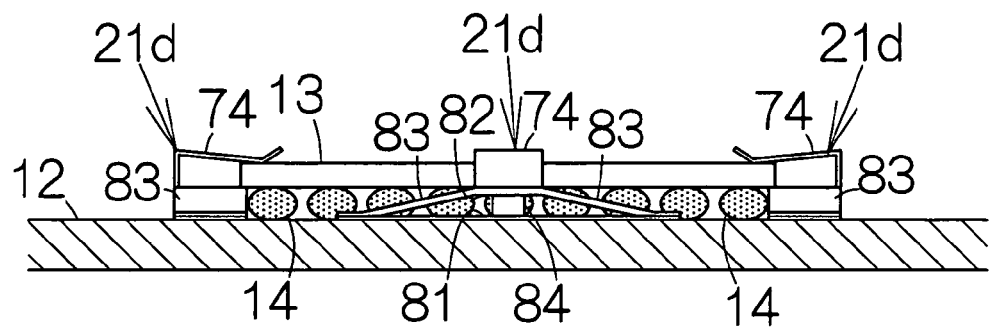
FIG. 18 is a side view of the detachment jig placed on a printed circuit board.

Referring also to FIG. 18, the tip end of the piece member 82 is inserted under the integrated circuit chip package 13 in a space between the printed circuit board 12 and the integrated circuit chip package 13. The holder 74 serves to hold the integrated circuit chip package 13 so as to establish contact between the piece member 72 and the lower surface of the integrated circuit chip package 13. The detachment jigs 21d are in this manner mounted on the printed circuit board 12. The printed circuit board unit 11 is then placed in a reflow oven along with the detachment jigs 21d. When the printed circuit board unit 11 is subjected to heat treatment in the reflow oven, the solder bumps 14 melt.

Figure 19:
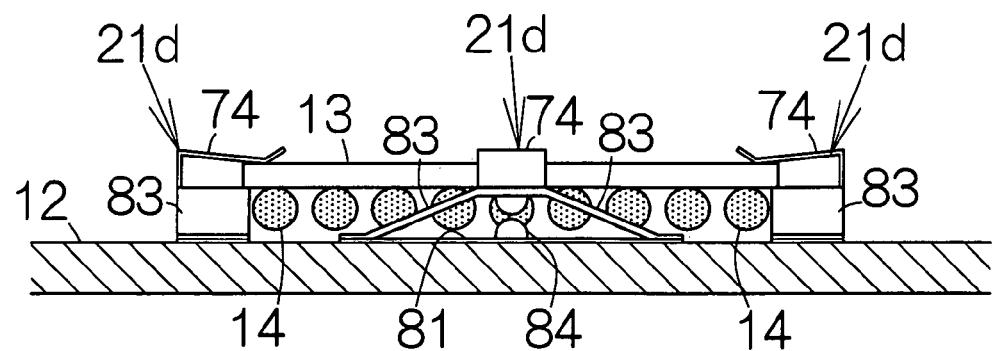
FIG. 19 is a side view of the detachment jig after the melt of the solder bumps.

When the temperature reaches 200 degrees Celsius in the reflow oven, for example, the joint member 84 melts down. The connection is released between the plate member 81 and the piece member 82. The piece member 82 is distanced away from the front surface of the printed circuit board 12 based on the elasticity of the elastic members 83. As shown in FIG. 19, the piece member 82 thus serves to lift the integrated circuit chip package 13 upward in the direction perpendicular to the front surface of the printed circuit board 12. The integrated circuit chip package 13 is thus completely detached from the front surface of the printed circuit board 12. The integrated circuit chip package 13 is then taken away from the printed circuit board 12. The detachment jigs 21d accompany the integrated circuit chip package 13.

One is allowed to enjoy advantages of the detachment jig 21d in the same manner as the aforementioned detachment jig 21c. Moreover, since a melting temperature can be set for the joint member 84 depending upon the melting point of the solder bumps 14. The detachment jig 21d may be utilized for various types of the solder bumps 14.

What is claimed is:

1. A method of removing an integrated circuit chip package, comprising:

placing a detachment jig on a printed circuit board, the detachment jig including first and second grasping members received on a surface of the printed circuit board, the first and second grasping members being forced to advance to each other;

allowing a solder bump of solid state, disposed between the printed circuit board and the integrated circuit chip package, to restrain the first and second grasping members from advancing to each other;

causing the solder bump to melt so as to remove restraint to the advance of the first and second grasping member; and allowing the first and second grasping members to glide to each other on the surface of the printed circuit board into a space between the printed circuit board and the integrated circuit chip package so that inclined surfaces of the first and second grasping members serve to lift the integrated circuit chip package from the surface of the printed circuit board.

2. The method according to claim 1, wherein the inclined surfaces contact with an outer periphery of the integrated circuit chip package after the first and second grasping members start advancing.

3. The method according to claim 1, wherein the printed circuit board is placed within an oven for causing the solder bump to melt.

4. The method according to claim 1, wherein an electrically conductive pad is adhered to the surface of the printed circuit board through an adhesive layer, and the electrically conductive pad receives the solder bump.

5. The method according to claim 1, wherein the first and second grasping members respectively include horizontal plates extending within a plane, the horizontal plates being received on the surface of the printed circuit board.

* * * * *